United States Patent
Yuan

(10) Patent No.: US 9,450,101 B2
(45) Date of Patent: Sep. 20, 2016

(54) THIN FILM TRANSISTOR, ARRAY SUBSTRATE AND DISPLAY APPARATUS

(71) Applicant: BOE Technology Group Co., Ltd., Beijing (CN)

(72) Inventor: Guangcai Yuan, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/136,994

(22) Filed: Dec. 20, 2013

(65) Prior Publication Data

US 2014/0175434 A1 Jun. 26, 2014

(30) Foreign Application Priority Data

Dec. 25, 2012 (CN) .......................... 2012 1 0570545

(51) Int. Cl.
- *H01L 29/786* (2006.01)
- *H01L 27/12* (2006.01)
- *H01L 29/78* (2006.01)

(52) U.S. Cl.
CPC ..... *H01L 29/78642* (2013.01); *H01L 27/1222* (2013.01); *H01L 29/7827* (2013.01); *H01L 29/7869* (2013.01); *H01L 29/78663* (2013.01); *H01L 29/78672* (2013.01)

(58) Field of Classification Search
CPC .............. H01L 29/785; H01L 29/786; H01L 29/66666; H01L 29/78642; G02F 1/134336
USPC ................. 257/43, 59, 60, 66, 72, 135, 329, 257/E21.483; 349/46, 43, 106, 38; 345/92; 438/627, 197
See application file for complete search history.

(56) References Cited

U.S. PATENT DOCUMENTS

| | | | |
|---|---|---|---|
| 5,166,085 A | 11/1992 | Wakai et al. | |
| 5,493,129 A | 2/1996 | Matsuzaki et al. | |
| 6,107,660 A * | 8/2000 | Yang | H01L 29/66666 257/329 |
| 8,273,654 B1 * | 9/2012 | Nelson | H01L 29/78642 257/E21.483 |
| 2006/0023134 A1* | 2/2006 | Um | G02F 1/134336 349/38 |
| 2013/0038517 A1* | 2/2013 | Kang | H01L 29/78642 345/92 |

FOREIGN PATENT DOCUMENTS

| | | |
|---|---|---|
| CN | 1081023 A | 1/1994 |
| CN | 1845341 A | 10/2006 |
| CN | 202259311 U | 5/2012 |
| CN | 102759832 A | 10/2012 |
| CN | 203026512 U | 6/2013 |
| EP | 0217406 B1 | 4/1987 |

OTHER PUBLICATIONS

First Chinese Office Action for Chinese Patent Application No. 201210570545.7, dated Dec. 3, 2014, 6 pages.

* cited by examiner

*Primary Examiner* — Kenneth Parker
*Assistant Examiner* — Young W Kim
(74) *Attorney, Agent, or Firm* — Westman, Champlin & Koehler, P.A.

(57) ABSTRACT

A thin film transistor, comprising: a substrate; a first electrode formed on the substrate; a first insulation layer formed on the first electrode; a gate electrode formed on the first insulation layer; a second insulation layer formed on the gate electrode; an active layer penetrating through the first and second insulation layers and electrically isolated from the gate electrode; and a second electrode formed on the active layer and electrically connected to the first electrode through the active layer, wherein the first electrode is one of a source electrode and a drain electrode, and the second electrode is the other of the source electrode and the drain electrode.

13 Claims, 2 Drawing Sheets

THIN FILM TRANSISTOR, ARRAY SUBSTRATE AND DISPLAY APPARATUS

CROSS-REFERENCE TO RELATED APPLICATION

This application claims the benefit of Chinese Patent Application No. 201210570545.7 filed on Dec. 25, 2012 in the State Intellectual Property Office of China, the whole disclosure of which is incorporated herein by reference.

BACKGROUND OF THE INVENTION

1. Field of the Invention

The present invention relates to a display technical field, more particularly, relates to a thin film transistor, an array substrate, and a display apparatus.

2. Description of the Related Art

Generally, in a conventional thin film transistor (TFT) array substrate, as shown in FIG. 1, a TFT device is mainly composed of a gate electrode 1, an active layer 3, a source electrode 4 and a drain electrode 5 disposed on a substrate in this order. The gate electrode 1 is electrically isolated from the active layer 3 by a gate insulation layer 2. The source electrode 4 and the drain electrode 5 are formed in the same layer and opposite to each other by a single patterning process. A horizontal channel structure is formed in a region facing the gate electrode 1 between the source electrode 4 and the drain electrode 5. The source electrode 4 is electrically connected to a data line. The drain electrode 5 is electrically connected to a pixel electrode 7 through a via in a passivation layer 6. When the gate electrode 1 is loaded with a gate scan signal, the active layer 3 above the gate electrode 1 is converted from a semiconductor state to a conductor state, and a current channel is formed in a surface of the active layer 3 facing the insulation layer 2. The current channel is opposite to the horizontal channel structure formed between the source electrode 4 and the drain electrode 5. An electrical signal which is loaded from the data line to the source electrode 4 can be transmitted to the pixel electrode 7 through the drain electrode 5 by the current channel so as to activate pixel units.

It can be seen from the conventional thin film transistor (TFT) array substrate that a current flowing through the current channel formed in the active layer 3 is increased with the increase of the gate scan signal loaded on the gate electrode 1. When the current flowing through the current channel is large, the electrical signal loaded from the data line can control the pixel electrode 7 well, achieving a high image display quality. However, in practice, a voltage of the gate scan signal applied on the gate electrode 1 is limited by a power consumption of a display panel and cannot be set over high. Accordingly, in order to increase the current flowing through the current channel 'a' formed in the active layer 3, it is necessary to change the structure of the TFT device and enlarge the total area thereof, because the current flowing through the current channel formed in the active layer 3 is constrained by the size of the horizontal channel structure in some extent. Thereby, the horizontal channel structure having a large size can increase the current flowing through the current channel. However, the large-sized horizontal channel structure can cause a problem of decreasing an aperture ratio of pixel units.

SUMMARY OF THE INVENTION

The present invention has been made to overcome or alleviate at least one aspect of the above mentioned disadvantages.

Accordingly, it is an object of the present invention to provide a thin film transistor (TFT), an array substrate and a display apparatus that can increase a conduction current of a TFT device as large as possible without increasing the area of the TFT device.

According to an aspect of the present invention, there is provided a thin film transistor, comprising: a substrate; a first electrode formed on the substrate; a first insulation layer formed on the first electrode; a gate electrode formed on the first insulation layer; a second insulation layer formed on the gate electrode; an active layer penetrating through the first and second insulation layers and electrically isolated from the gate electrode; and a second electrode formed on the active layer and electrically connected to the first electrode through the active layer, wherein the first electrode is used as one of a source electrode and a drain electrode, and the second electrode is used as the other of the source electrode and the drain electrode.

According to another aspect of the present invention, there is provided an array substrate comprising the above thin film transistor.

According to another aspect of the present invention, there is provided a display apparatus comprising the above array substrate.

According to another aspect of the present invention, there is provided a method for producing a thin film transistor, comprising:

forming a first electrode on a substrate;

forming a first insulation layer on the first electrode;

forming a gate electrode on the first insulation layer;

forming a second insulation layer on the gate electrode, and forming a via penetrating through the first and second insulation layers by a single patterning process;

forming an active layer in the via penetrating through the first and second insulation layers, the active layer being electrically isolated from the gate electrode;

forming a second electrode on the active layer, the second electrode being electrically connected to the first electrode through the active layer, wherein the first electrode is used as one of a source electrode and a drain electrode, and the second electrode is used as the other of the source electrode and the drain electrode.

In the TFT, the method for producing the TFT, the array substrate and the display apparatus according to various embodiments of the present invention, the channel formed between the source electrode and the drain electrode of the TFT device is changed from a conventional horizontal channel structure to a vertical channel structure, and the gate electrode is disposed in the same horizontal plane as the vertical channel structure. In this way, when the gate electrode is loaded with the gate scan signal, a current channel perpendicular to the substrate is formed in a side of the active layer adjacent to the gate electrode, and the current channel electrically communicates the first and second electrodes connected to the active layer so as to activate the TFT device. In the present invention, by increasing the thickness of the gate electrode in a vertical direction, the height of the vertical channel structure can be increased, the conduction current of the TFT device can be enhanced, and the performance of the TFT device can be improved. Furthermore, in the present invention, by replacing the conventional horizontal channel structure with the vertical channel structure, an area occupied by the TFT device on the substrate can be decreased, increasing the aperture ratio of the pixel units.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF PREFERRED EMBODIMENTS OF THE INVENTION

Figure 1:
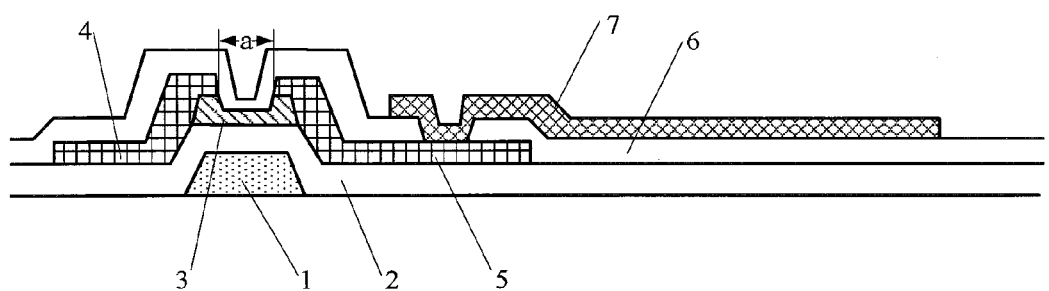
FIG. 1 is an illustrative structure view of a TFT array substrate in prior arts.

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

Hereafter, it will describe in detail a thin film transistor, a method for producing the thin film transistor, an array substrate and a display apparatus according to exemplary embodiments of the present invention with reference to the accompanying drawings.

Figure 2:
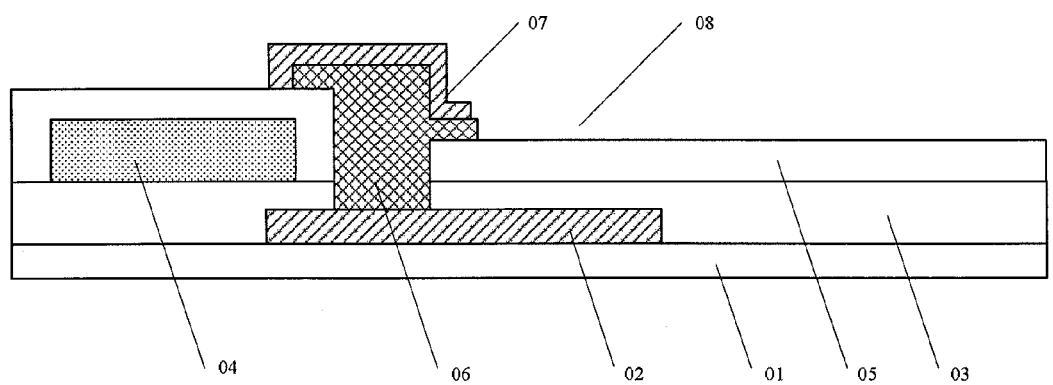
FIG. 2 is an illustrative structure view of a TFT according to an exemplary embodiment of the present invention.

According to an exemplary embodiment of the present invention, there is provided a thin film transistor, as shown in FIG. 2, the thin film transistor comprising:

a substrate 01;

a first electrode 02 formed on the substrate 01;

a first insulation layer 03 formed on the first electrode 02;

a gate electrode 04 formed on the first insulation layer 03;

a second insulation layer 05 formed on the gate electrode 04;

an active layer 06 penetrating through the first and second insulation layers 03, 05 and electrically isolated from the gate electrode 04; and a second electrode 07 formed on the active layer 06 and electrically connected to the first electrode 02 through the active layer 06, wherein the first electrode 02 is used as one of a source electrode and a drain electrode, and the second electrode 07 is use as the other of the source electrode and the drain electrode.

In an exemplary embodiment of the present invention, the first electrode 02 may be used as the source electrode, and the second electrode 07 may be used as the drain electrode. Alternatively, in another exemplary embodiment, the first electrode 02 may be used as the drain electrode, and the second electrode 07 may be used as the source electrode.

In the above thin film transistor, when the gate electrode 04 is loaded with a gate scan signal, a current channel perpendicular to the substrate 01 (referred as a vertical channel structure hereafter) is formed in a side of the active layer 06 adjacent to the gate electrode 04, and the current channel electrically communicates the first and second electrodes 02, 07 connected to the active layer 06 so as to activate the TFT device. As a result, a gray scale signal loaded on the data signal line is transmitted to a pixel electrode connected to the second electrode 07 through the first electrode 02 as well as the current channel formed in the active layer 06.

In the thin film transistor according to an exemplary embodiment of the present invention, by increasing the thickness of the gate electrode 04 in a vertical direction, the height of the vertical channel structure can be increased, the conduction current of the TFT device can be enhanced, and the performance of the TFT device can be improved. Furthermore, by replacing a conventional horizontal channel structure with the vertical channel structure, an area occupied by the TFT device on the substrate can be decreased, increasing the aperture ratio of the pixel units.

In an exemplary embodiment, the thickness of the gate electrode may be determined based on the conduction current in practice. For example, the thickness of the gate electrode may be within a range of 10 nm~2000 nm.

In an exemplary embodiment, the above TFT device may comprise an oxide TFT, that is, the active layer 06 of the TFT device is made of an oxide semiconductor material, such as, Indium gallium zinc oxide (IGZO), Indium gallium tin oxide (IGTO), Indium zinc oxide (IZO), etc. Correspondingly, the first and second insulation layers 03, 05 of the TFT device may be made of an inorganic insulation material, such as, $SiO_2$, SiNx, SiOxNy, $Al_2O_3$, TiOx, etc.

In an exemplary embodiment, if the first and second insulation layers 03, 05 are made of the inorganic insulation material, the thickness of the first insulation layer 03 or the second insulation layer 05 is commonly controlled within a range of 50 nm~500 nm.

In another exemplary embodiment, the TFT device may comprise a Low Temperature Poly Silicon (LTPS) TFT, that is, the active layer 06 of the TFT device is made of amorphous silicon, polycrystalline silicon or microcrystalline silicon. Correspondingly, the first and second insulation layers 03, 05 of the TFT device may be made of an organic insulation material, such as, a resin insulation material, an acrylic series of insulation material, etc.

In an exemplary embodiment, if the first and second insulation layers 03, 05 are made of the organic insulation material, the thickness of the first insulation layer 03 or the second insulation layer 05 is commonly controlled within a range of 0.5 μm~2.5 μm.

In an exemplary embodiment, as shown in FIG. 2, the gate electrode 04 is disposed between the first electrode 02 and the second electrode 07.

In an exemplary embodiment, as shown in FIG. 2, the gate electrode 04 is disposed between the first insulation layer 03 and the second insulation layer 05.

In an exemplary embodiment, as shown in FIG. 2, the active layer 06 extends upward beyond a top surface of the second insulation layer 05.

According to another aspect of the present invention, there is provided an array substrate comprising the thin film transistor mentioned in the above embodiments.

Figure 3:
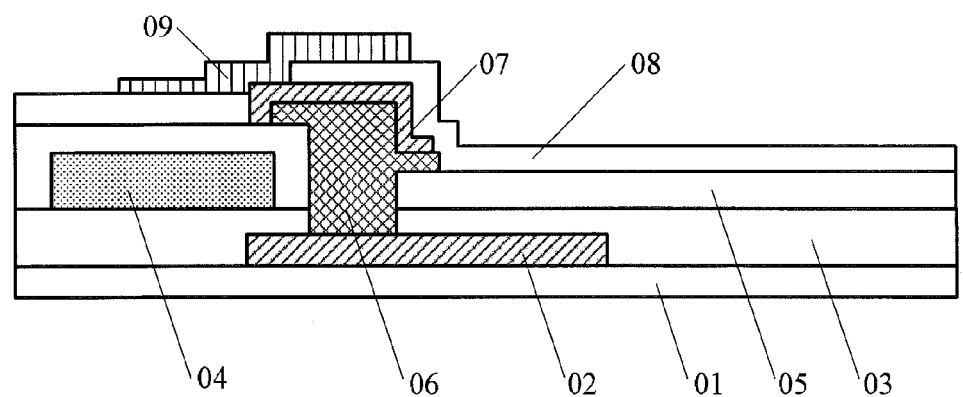
FIG. 3 is an illustrative structure view of a TFT array substrate according to an exemplary embodiment of the present invention.

In an exemplary embodiment, as shown in FIG. 3, the array substrate may further comprise a pixel electrode 09 formed on the second electrode 07 and electrically connected to the second electrode 07.

Furthermore, as shown in FIG. 3, the array substrate may further comprise a passivation layer 08 formed between the second electrode 07 and the pixel electrode 09. The passivation layer 08 may have a via through which the pixel electrode 09 is electrically connected to the second electrode 07.

Furthermore, in an exemplary embodiment, the above TFT array substrate may be applied in a crystal display panel, an Organic Light-Emitting Diode (OLED) display device, an organic electroluminescent device (OELD), etc.

Figure 4:
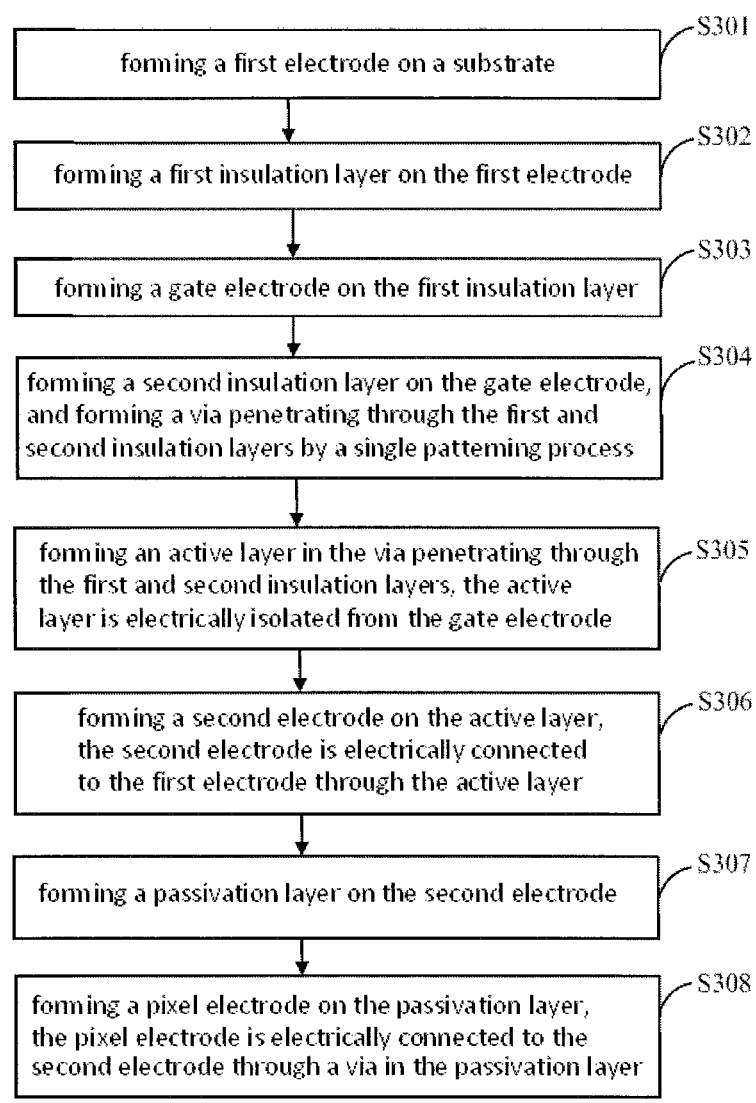
FIG. 4 is a flow chart of producing a TFT array substrate according to an exemplary embodiment of the present invention.

According to another aspect of the present invention, there is provided a method for producing a thin film transistor. In an exemplary embodiment, as shown in FIG. 4, the method comprising steps of:

S301: forming a first electrode on a substrate;

In an exemplary embodiment, the first electrode is often produced by megnetron sputtering. Furthermore, the first electrode may be made of metal, such as, Mo, Mo—Al—Mo alloy, Mo/Al—Nd/Mo lamination, Al and Al alloy, Cu and Cu alloy, Mo/Nd/Cu lamination, Ti/Cu lamination, etc. Furthermore, the thickness of the first electrode is commonly controlled within a range of 50 nm~500 nm.

S302: forming a first insulation layer on the first electrode;

In an exemplary embodiment, the material of the first insulation layer is selected based on the material of the active layer. If the active layer is made of an oxide semiconductor material, the first insulation layer is made of an inorganic insulation material, such as, $SiO_2$, SiNx, SiOxNy, $Al_2O_3$, TiOx, etc. In this case, the thickness of the first insulation layer is often controlled within a range of 50 nm~500 nm. If the active layer is made of amorphous silicon or polycrystalline silicon, the first insulation layer is made of an organic insulation material, such as, a resin insulation material, an acrylic series of insulation material, etc. In this case, the thickness of the first insulation layer is often controlled within a range of 0.5 μm~2.5 μm.

Furthermore, during producing the first insulation layer, an annealing process must be performed to prevent the semiconductor characteristics of the active layer from being disadvantageously affected by the hydrogen element and the hydrogen compound contained in the first insulation layer.

In an exemplary embodiment, a vacuum annealing may be adopted, or the annealing process may be performed under the protection of inert gas, for example, nitrogen. Generally, the annealing process may be performed at a temperature of 250° C.-500° C. for a period of 10 min~150 min.

S303: forming a gate electrode on the first insulation layer;

In an exemplary embodiment, the gate electrode may be made of metal, such as, Mo, Mo—Al—Mo alloy, Mo/Al—Nd/Mo lamination, Al and Al alloy, Cu and Cu alloy, Mo/Nd/Cu lamination, Ti/Cu lamination, etc.

S304: forming a second insulation layer on the gate electrode, and forming a via penetrating through the first and second insulation layers by a single patterning process;

In an exemplary embodiment, the material of the second insulation layer is selected based on the material of the active layer. If the active layer is made of an oxide semiconductor material, the second insulation layer is made of an inorganic insulation material, such as, $SiO_2$, SiNx, SiOxNy, $Al_2O_3$, TiOx, etc. In this case, the thickness of the second insulation layer is often controlled within a range of 50 nm~500 nm. If the active layer is made of amorphous silicon or polycrystalline silicon, the second insulation layer is made of an organic insulation material, such as, a resin insulation material, an acrylic series of insulation material, etc. In this case, the thickness of the second insulation layer is often controlled within a range of 0.5 μm~2.5 μm.

Furthermore, in a case where the first and second insulation layers are made of the inorganic film material, the via penetrating through the first and second insulation layers is commonly formed by a single patterning process, for example, a dry etching. Furthermore, in a case where the first and second insulation layers are made of the organic film material, the via penetrating through the first and second insulation layers is commonly formed by a single patterning process, for example, an exposure developing.

S305: forming an active layer in the via penetrating through the first and second insulation layers, the active layer being electrically isolated from the gate electrode;

In an exemplary embodiment, if the active layer is made of the oxide semiconductor material, the oxide semiconductor material may be deposited by megnetron sputtering and processed by wet etching to form the pattern of the active layer.

In another exemplary embodiment, if the active layer is made of amorphous silicon, polycrystalline silicon or microcrystalline silicon, the amorphous silicon, the polycrystalline silicon or the microcrystalline silicon may be deposited by Plasma Enhanced Chemical Vapor Deposition (PECVD) and processed by dry etching to form the pattern of the active layer. Furthermore, the active layer may be controlled to have a thickness of 10 nm~2000 nm.

S306: forming a second electrode on the active layer, the second electrode being electrically connected to the first electrode through the active layer, wherein the first electrode is one of a source electrode and a drain electrode, and the second electrode is the other of the source electrode and the drain electrode.

In an exemplary embodiment, the second electrode is commonly deposited by megnetron sputtering and patterned by wet etching. Furthermore, the second electrode may be made of, for example, Mo, Mo—Al—Mo alloy, Mo/Al—Nd/Mo lamination, Cu and Cu alloy, Ti and Ti alloy, Indium tin oxide (ITO), Ti/Al/Ti lamination, Mo/ITO, etc. Furthermore, the thickness of the second electrode is commonly controlled within a range of 100 nm~350 nm.

Furthermore, when the above thin film transistor according to embodiments of the present invention is applied in an array substrate, as shown in FIG. 4, the method may further comprise steps of:

S307: forming a passivation layer on the second electrode;

In an exemplary embodiment, the passivation layer may be made of an inorganic insulation material, such as, $SiO_2$, SiNx, SiOxNy, $Al_2O_3$, TiOx, $Y_2O_3$, etc. Furthermore, a via for connecting the second electrode to a pixel electrode to be formed may be formed in the passivation layer by dry etching. In this case, the thickness of the passivation layer may be controlled within a range of 20 nm~500 nm.

Furthermore, in order to applying the TFT device in the Active Matrix/Organic Light Emitting Diode (AMOLED) to improve the processability of AMOLED, the passivation layer may be made of an organic insulation material, such as, a resin insulation material, an acrylic series of insulation material, etc. Furthermore, a via for connecting the second electrode to a pixel electrode to be formed may be formed in the passivation layer by exposure developing. In this case, the thickness of the passivation layer may be controlled within a range of 0.5 μm~2.5 μm.

S308: forming a pixel electrode on the passivation layer, the pixel electrode being electrically connected to the second electrode through a via in the passivation layer.

In an exemplary embodiment, the pixel electrode may be made of ITO, Al/ITO lamination, Mg/Ag/ITO lamination, etc.

But the present invention is not limited to the above embodiments, for example, the step S307 is not necessary and may be omitted. In this case, the pixel electrode may be directly formed on the second electrode, simplifying the process flow of producing the thin film transistor, and its further description is omitted herein.

According to another aspect of the present invention, there is provided a display apparatus comprising the above array substrate according to above embodiments of the present invention.

In the TFT, the method for producing the TFT, the array substrate and the display apparatus according to various embodiments of the present invention, the channel formed between the source electrode and the drain electrode of the TFT device is changed from a conventional horizontal channel structure to a vertical channel structure, and the gate electrode is disposed in the same horizontal plane as the vertical channel structure. In this way, when the gate electrode is loaded with the gate scan signal, a current channel perpendicular to the substrate is formed in a side of the active layer adjacent to the gate electrode, and the current channel electrically communicates the first and second electrodes connected to the active layer so as to activate the TFT device. In the present invention, by increasing the thickness of the gate electrode in a vertical direction, the height of the vertical channel structure can be increased, the conduction current of the TFT device can be enhanced, and the performance of the TFT device can be improved. Furthermore, in the present invention, by replacing the conventional horizontal channel structure with the vertical channel structure, an area occupied by the TFT device on the substrate can be decreased, increasing the aperture ratio of the pixel units.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

What is claimed is:

1. A thin film transistor, comprising:
    a substrate;
    a first electrode formed on the substrate;
    a first insulation layer formed on the first electrode;
    a gate electrode formed on the first insulation layer;
    a second insulation layer formed on the gate electrode;
    an active layer formed in a hole penetrating through the first and second insulation layers, wherein the active layer is filled in the whole hole, the hole does not run through the gate electrode and is physically isolated from the gate electrode, so that the active layer is electrically isolated from the gate electrode; and
    a second electrode formed on the active layer and electrically connected to the first electrode through the active layer,
    wherein the first electrode is used as one of a source electrode and a drain electrode, and the second electrode is used as the other of the source electrode and the drain electrode.

2. The thin film transistor according to claim 1, wherein the gate electrode is located between the first electrode and the second electrode.

3. The thin film transistor according to claim 2, wherein the gate electrode is located between the first insulation layer and the second insulation layer.

4. The thin film transistor according to claim 1, wherein the active layer is formed to extend upward beyond a top surface of the second insulation layer.

5. The thin film transistor according to claim 1, wherein the active layer is made of oxide semiconductor material, and the first and second insulation layers are made of inorganic insulation material.

6. The thin film transistor according to claim 2, wherein the first insulation layer or the second insulation layer has a thickness of 50 nm~500 nm.

7. The thin film transistor according to claim 1, wherein the active layer is made of amorphous silicon, polycrystalline silicon or microcrystalline silicon, and the first and second insulation layers are made of organic insulation material.

8. The thin film transistor according to claim 7, wherein the first insulation layer or the second insulation layer has a thickness of 0.5 µm~2.5 µm.

9. The thin film transistor according to claim 1, wherein the gate electrode has a thickness of 10 nm~2000 nm.

10. An array substrate comprising a thin film transistor according to claim 1, the thin film transistor comprising:
    a substrate;
    a first electrode formed on the substrate;
    a first insulation layer formed on the first electrode;
    a gate electrode formed on the first insulation layer;
    a second insulation layer formed on the gate electrode;
    an active layer penetrating through the first and second insulation layers and electrically isolated from the gate electrode; and
    a second electrode formed on the active layer and electrically connected to the first electrode through the active layer,
    wherein the first electrode is used as one of a source electrode and a drain electrode, and the second electrode is used as the other of the source electrode and the drain electrode.

11. The array substrate according to claim 10, further comprising:
    a pixel electrode formed on the second electrode and electrically connected to the second electrode.

12. The array substrate according to claim 10, further comprising:
    a passivation layer formed between the second electrode and the pixel electrode and having a via through which the pixel electrode is electrically connected to the second electrode.

13. A display apparatus comprising an array substrate according to claim 10, the array substrate comprising a thin film transistor, the thin film transistor comprising:
    a first electrode formed on the substrate;
    a first insulation layer formed on the first electrode;
    a gate electrode formed on the first insulation layer;
    a second insulation layer formed on the gate electrode;
    an active layer penetrating through the first and second insulation layers and electrically isolated from the gate electrode; and
    a second electrode formed on the active layer and electrically connected to the first electrode through the active layer,
    wherein the first electrode is used as one of a source electrode and a drain electrode, and the second electrode is used as the other of the source electrode and the drain electrode.

* * * * *